US012706636B2

(12) United States Patent
Yu et al.

(10) Patent No.: US 12,706,636 B2
(45) Date of Patent: Aug. 11, 2026

(54) NEAR-FIELD COMMUNICATION CHIP, PHASE SYNCHRONIZATION METHOD, AND ELECTRONIC DEVICE

(71) Applicant: HUAWEI TECHNOLOGIES CO., LTD., Shenzhen (CN)

(72) Inventors: Rui Yu, Singapore (SG); Xuesong Chen, Singapore (SG); Supeng Liu, Singapore (SG); Lei Wang, Singapore (SG); Zhan Yu, Singapore (SG); Theng Tee Yeo, Singapore (SG)

(73) Assignee: Huawei Technologies Co., Ltd., Shenzhen (CN)

( * ) Notice: Subject to any disclaimer, the term of this patent is extended or adjusted under 35 U.S.C. 154(b) by 306 days.

(21) Appl. No.: 18/534,194

(22) Filed: Dec. 8, 2023

(65) Prior Publication Data

US 2024/0106497 A1 Mar. 28, 2024

Related U.S. Application Data

(63) Continuation of application No. PCT/CN2021/099251, filed on Jun. 9, 2021.

(51) Int. Cl.
*H04B 5/72* (2024.01)
*H03L 7/099* (2006.01)
(Continued)

(52) U.S. Cl.
CPC ............... *H04B 5/72* (2024.01); *H03L 7/099* (2013.01); *H04B 5/24* (2024.01); *H04B 5/48* (2024.01); *H04B 5/45* (2024.01)

(58) Field of Classification Search
CPC ........... H04B 5/45; H04B 5/77; H03L 7/0099; H04W 4/80
See application file for complete search history.

(56) References Cited

U.S. PATENT DOCUMENTS 8,934,836 B2 1/2015 Lefley
9,559,833 B1 1/2017 Xu et al.
(Continued)

FOREIGN PATENT DOCUMENTS

EP 3337049 A1 6/2018

OTHER PUBLICATIONS

Coskun et al., "A Survey on Near Field Communication (NFC) Technology," Article in Wireless Personal Communications, total 38 pages (Aug. 2013).

(Continued)

*Primary Examiner* — Wen W Huang
(74) *Attorney, Agent, or Firm* — Leydig, Voit & Mayer, Ltd.

(57) ABSTRACT

A near-field communication (NFC) chip, a phase synchronization method, and an electronic device related to the field of communication technologies are provided, to quickly synchronize a transmitted signal of an NFC card device with a carrier of an NFC card reader. The NFC chip includes a processing circuit configured to: determine a first carrier frequency offset between a local clock signal and a carrier clock signal, and generate a first frequency control word based on the first carrier frequency offset. The NFC chip further includes a phase-locked loop configured to generate a first clock signal based on the local clock signal and the first frequency control word. The NFC chip also includes a phase alignment circuit configured to perform phase selection on the first clock signal based on the carrier clock signal to obtain a second clock signal, and send the second clock signal to a transmitter circuit.

16 Claims, 7 Drawing Sheets

(51) Int. Cl.

| | |
|---|---|
| ***H04B 5/24*** | (2024.01) |
| ***H04B 5/45*** | (2024.01) |
| ***H04B 5/48*** | (2024.01) |

(56) References Cited

U.S. PATENT DOCUMENTS

| | | | | |
|---|---|---|---|---|
| 2014/0218176 | A1* | 8/2014 | Thueringer | H04B 5/45 340/10.5 |
| 2016/0197718 | A1* | 7/2016 | Michel | H04L 7/0087 375/300 |
| 2018/0025267 | A1* | 1/2018 | Kunc | G06K 19/0775 235/492 |
| 2018/0110018 | A1* | 4/2018 | Yu | H04W 56/0035 |
| 2018/0198489 | A1* | 7/2018 | Leow | H04L 7/0331 |
| 2018/0248722 | A1* | 8/2018 | Wicaksana | H04L 27/2657 |
| 2018/0324012 | A1 | 11/2018 | Stiglic et al. | |
| 2019/0020467 | A1* | 1/2019 | Stiglic | H04L 7/0331 |
| 2019/0230611 | A1 | 7/2019 | Houdebine | |
| 2019/0384951 | A1* | 12/2019 | Stiglic | H04L 27/20 |
| 2020/0413239 | A1* | 12/2020 | Pu | H04L 27/2659 |
| 2021/0175933 | A1* | 6/2021 | Pirch | G06K 19/0726 |

OTHER PUBLICATIONS

Gebhart et al., “Active Load Modulation for Contactless Near-Field Communication, ” total 6 pages (Nov. 1, 2012).

“NFC for embedded applications, Your critical link for the Internet of Things,” https://www.nxp.com/docs/en/brochure/75017587.pdf, total 20 pages (Aug. 2014).

* cited by examiner

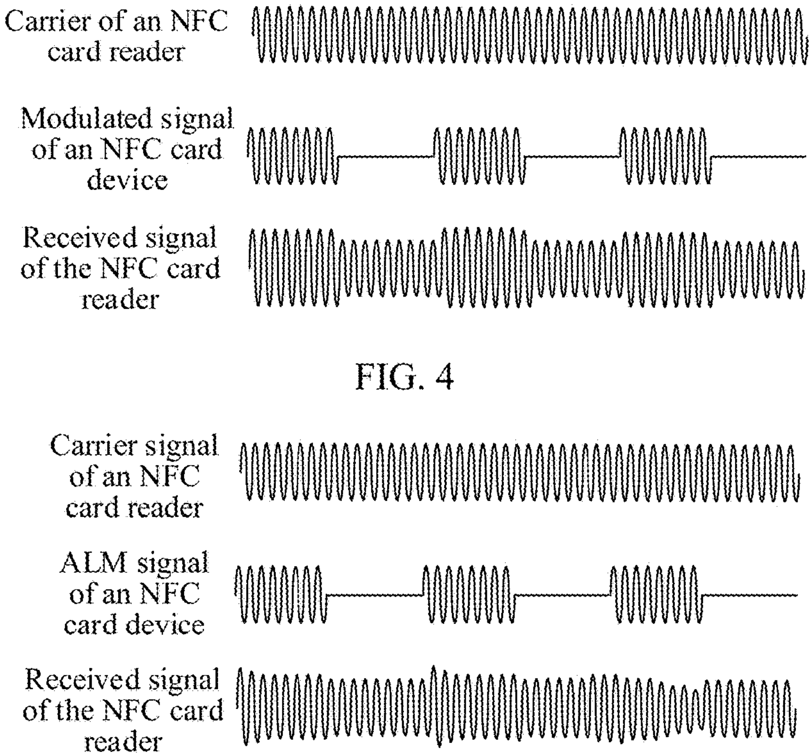
FIG. 4
FIG. 5
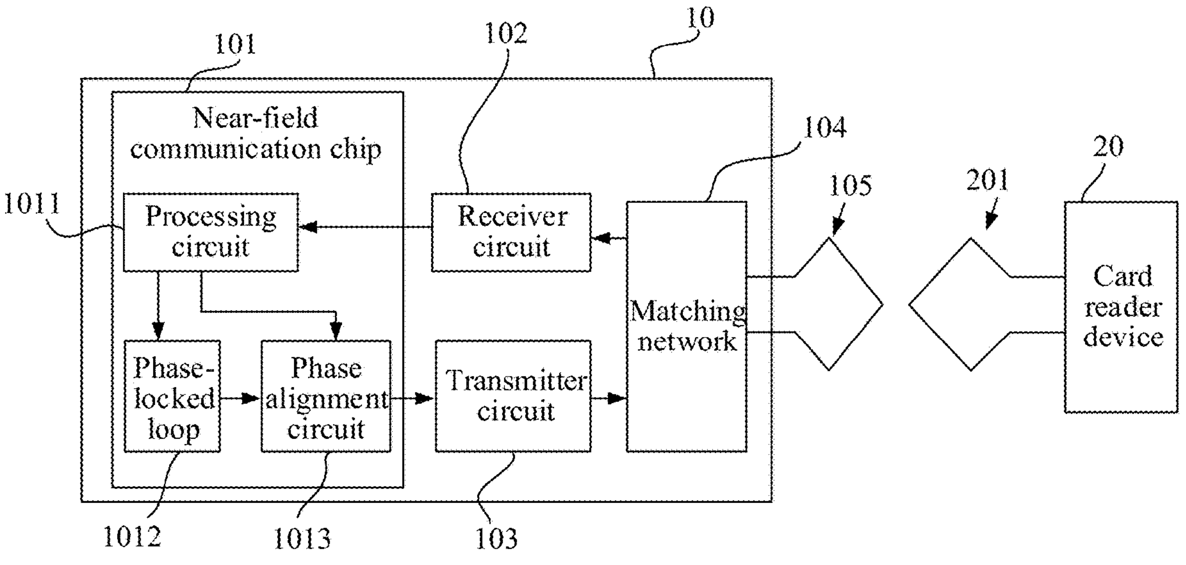
FIG. 6

NEAR-FIELD COMMUNICATION CHIP, PHASE SYNCHRONIZATION METHOD, AND ELECTRONIC DEVICE

CROSS-REFERENCE TO RELATED APPLICATIONS

This application is a continuation of International Application No. PCT/CN2021/099251, filed on Jun. 9, 2021, the disclosure of which is hereby incorporated by reference in its entirety.

TECHNICAL FIELD

Embodiments of this application relate to the field of communication technologies, and in particular, to a near-field communication chip, a phase synchronization method, and an electronic device.

BACKGROUND

As a new communication technology, near-field communication (NFC) has been widely used in smart mobile phones in recent years. The NFC can be widely applied in many scenarios, including mobile payment, identity authentication, quick establishment of other communication connections, and the like. Unique quickness and security thereof make the NFC highly competitive in an internet of things (IoT) environment. The NFC is actually a radio frequency identification (RFID) technology that operates at a high frequency of 13.56 MHz and provides a data transmission rate of 106 kbps to 424 kbps over a short distance of a few centimeters (usually up to 10 cm).

The NFC device includes an NFC card reader and an NFC target device (or referred to as an NFC card device). The NFC card device is activated only within a response range of the NFC card reader. A typical NFC communication scenario is as follows: The NFC card reader sends a carrier signal, and the NFC card device modulates a subcarrier signal on the carrier signal through load modulation (LM). A load modulation mode includes passive load modulation (PLM) and active load modulation (ALM). Because relatively large antennas can be embedded in a card, the PLM can reliably generate enough load modulation amplitudes. However, for a mobile phone or a wearable device that supports the NFC, because space of this type of device is limited, an antenna needs to be designed small enough to adapt to a specific structure and specific space. In addition, a metal, a circuit, and a radio frequency (RF) signal in the mobile phone or the wearable device further affect a mutual inductance coefficient and a mutual inductance value of an antenna between the NFC card reader and the NFC card device. As a result, the PLM cannot produce enough amplitude modulation in the NFC card reader.

In contrast, the ALM means that the NFC card device synchronously superimposes a transmitted signal (an active load modulation signal of the NFC card device) onto a carrier of the NFC card reader to generate amplitude modulation. In other words, the transmitted signal of the NFC card device needs to be synchronized with a carrier clock signal of the carrier of the NFC card reader. In a case of smaller antennas and weaker coupling, compensation may be implemented in the ALM by transmitting more power consumption. However, because different clock signal sources are used in the NFC card device and the NFC card reader, how to quickly synchronize a transmitted signal transmitted by the NFC card device with a carrier of the NFC card reader is a problem to be resolved.

SUMMARY

Embodiments of this application provide a near-field communication chip, a phase synchronization method, and an electronic device, to quickly synchronize a transmitted signal of an NFC card device with a carrier of an NFC card reader.

To achieve the foregoing objectives, the following technical solutions are used in this application.

According to a first aspect, a near-field communication chip is provided. The chip includes a processing circuit, a phase-locked loop, and a phase alignment circuit. The processing circuit is configured to determine a first carrier frequency offset (CFO) between a local clock signal and a carrier clock signal Clk-ext, and generate a first frequency control word (FCW) based on the first carrier frequency offset. The carrier clock signal Clk-ext is determined based on a received signal received by the near-field communication chip. For example, the received signal may be received by a receiver circuit in a receive mode. The phase-locked loop is configured to generate a first clock signal based on the local clock signal and the first frequency control word FCW. For example, the phase-locked loop may perform frequency control on the local clock signal based on the first frequency control word. The phase alignment circuit is configured to perform phase selection on the first clock signal based on the carrier clock signal Clk-ext to obtain a second clock signal, and send the second clock signal to a transmitter circuit. The transmitter circuit may transmit a data frame through the second clock signal in a transmit mode by using active load modulation. In this way, the chip provided in embodiments of this application can first recover, in the receive mode, the carrier clock signal Clk-ext from the received signal received by the receiver circuit, and determine the first carrier frequency offset CFO between the local clock signal and the carrier clock signal Clk-ext. Then, the first frequency control word (FCW) generated by the first carrier frequency offset (CFO) controls the phase-locked loop to generate the first clock signal based on the local clock signal. Finally, the phase alignment circuit performs phase selection on the first clock signal based on the carrier clock signal Clk-ext to obtain the second clock signal. In other words, the second clock signal and the carrier clock signal are phase aligned. Therefore, in a transmit mode, when the transmitter circuit transmits the data frame by using the second clock signal through active load modulation, it can be ensured that a formed transmitted signal is phase aligned with the carrier clock signal, so that fast synchronization between a transmitted signal of an NFC card device and a carrier of an NFC card reader can be implemented.

In a possible implementation, the phase alignment circuit is specifically configured to sample the first clock signal at a first sampling frequency to obtain the N sampling clock signals. The first sampling frequency is N times a frequency of the first clock signal, and N is a positive integer. The phase alignment circuit is configured to: obtain, from the N sampling clock signals based on a first phase sampling signal of a data frame and a phase shift accumulated from a second carrier frequency offset CFO that is between the carrier clock signal and the first clock signal and that is generated by the processing circuit, a second clock signal having a smallest phase difference from the carrier clock signal; and send the second clock signal to the transmitter circuit. Because the first sampling frequency is N times the frequency of the first clock signal, that is, it is equivalent to oversampling the first clock signal, a phase error can be reduced, and precision of phase alignment can be improved. For example, when the phase alignment circuit uses 64 times (that is, N=64) oversampling, it is ensured that the phase error is less than) 6° (360°/64≈6°).

In a possible implementation, the processing circuit is configured to generate the first frequency control word when determining that the first carrier frequency offset CFO is greater than a first threshold. In this process, the phase-locked loop adjusts frequency of the local clock signal based on the first frequency control word FCW to lock the first clock signal. To avoid excessively frequent adjustment of an output of the phase-locked loop, a first threshold X may be set for the first carrier frequency offset CFO. The processing circuit generates the first frequency control word FCW only when determining that the first carrier frequency offset CFO is greater than the first threshold X. The first carrier frequency offset CFO implements coarse adjustment on a local clock signal locked by the phase-locked loop to generate the first clock signal.

In a possible implementation, the phase alignment circuit is configured to: when the processing circuit determines that the second carrier frequency offset CFO is greater than a second threshold, obtain the second clock signal having the smallest phase difference from the carrier clock signal. Phase alignment is performed before the data frame starts to be sent. Certainly, if a phase shift caused by the second carrier frequency offset CFO in a process of sending a data frame does not affect normal demodulation of a signal by the NFC card reader, the phase alignment may be performed. The phase alignment may be performed only when the phase shift caused by the second carrier frequency offset CFO affects normal demodulation of a signal by the NFC card reader. Therefore, a second threshold Y may be set for the second carrier frequency offset CFO. When determining that the second carrier frequency offset CFO is greater than the second threshold, the processing circuit of a phase alignment apparatus calculates a compensated phase signal obtained after phase compensation based on the phase shift phase-shift-dbb, and updates the second clock signal, thereby implementing fine adjustment to a phase.

In a possible implementation, the processing circuit is specifically configured to obtain the carrier clock signal of the received signal when determining to use binary phase shift keying (BPSK) based on the data frame. In a BPSK mode, because the transmitter circuit keeps transmitting (the receiver circuit is in a saturated state) after the data frame starts to be sent, Clk-ext cannot be recovered. However, the phase alignment can still be performed on the transmitted signal of the NFC card device and the carrier of the NFC card reader to implement fast synchronization.

In a possible implementation, the processing circuit is further configured to: when determining to use non-BPSK based on the data frame, obtain the carrier clock signal at a first bit in the data frame, and generate a second frequency control word based on the carrier clock signal. The phase-locked loop is configured to generate a third clock signal based on the local clock signal and the second frequency control word. The phase alignment circuit is configured to perform phase selection on the third clock signal based on the carrier clock signal to obtain a fourth clock signal, and send the fourth clock signal to the transmitter circuit. The fourth clock signal is used by the transmitter circuit to transmit a second bit in the data frame. The first bit is different from the second bit. For example, when the first bit is 0, the second bit is 1. In a non-BPSK mode, after the data frame starts to be sent, the transmitter circuit does not transmit at bit 0 but transmits at bit 1. Therefore, the phase alignment may be performed at bit 0, and then 1 bit in the data frame is sent by using the fourth clock signal obtained after the phase alignment.

According to a second aspect, an electronic device is provided, including a near-field communication chip, a receiver circuit, and a transmitter circuit. The near-field communication chip is respectively coupled to the receiver circuit and the transmitter circuit. The near-field communication chip is configured to obtain a received signal through the receiver circuit, and determine a carrier clock signal based on the received signal; determine a first carrier frequency offset between a local clock signal of the near-field communication chip and the carrier clock signal, and generate a first frequency control word based on the first carrier frequency offset; perform frequency control on the local clock signal based on the first frequency control word to generate a first clock signal; and perform phase selection on the first clock signal based on the carrier clock signal to obtain a second clock signal, and send the second clock signal to the transmitter circuit. The transmitter circuit is configured to perform active load modulation by using the second clock signal.

In a possible implementation, the near-field communication chip is specifically configured to sample the first clock signal at a first sampling frequency to obtain N sampling clock signals. The first sampling frequency is N times a frequency of the first clock signal, and N is a positive integer; obtain, from the N sampling clock signals based on a first phase sampling signal of a data frame and a phase shift accumulated from a second carrier frequency offset between the carrier clock signal and the first clock signal, a second clock signal having a smallest phase difference from the carrier clock signal.

In a possible implementation, the near-field communication chip is further configured to: before generating the first frequency control word based on the first carrier frequency offset, determine that the first carrier frequency offset is greater than a first threshold.

In a possible implementation, the near-field communication chip is further configured to: before obtaining, from the N sampling clock signals, the second clock signal having the smallest phase difference from the carrier clock signal, determine that a phase shift accumulated from the second carrier frequency offset is greater than a second threshold.

In a possible implementation, before determining the first carrier frequency offset between the local clock signal and the carrier clock signal, the near-field communication chip is further configured to determine to use BPSK based on the data frame.

In a possible implementation, the near-field communication chip is further configured to: when determining to use non-BPSK based on the data frame, obtain the carrier clock signal at a first bit in the data frame, and generate a second frequency control word based on the carrier clock signal; perform frequency control on the local clock signal based on the second frequency control word to generate a third clock signal; and perform phase selection on the third clock signal based on the carrier clock signal to obtain a fourth clock signal. The transmitter circuit is configured to perform active load modulation by using the fourth clock signal to transmit a second bit in the data frame. The first bit is different from the second bit.

According to a third aspect, a phase synchronization method of a near-field communication chip is provided, including: determining a first carrier frequency offset between a local clock signal and a carrier clock signal that is determined based on a received signal, and generating a first frequency control word based on the first carrier frequency offset; performing frequency control on the local clock signal based on the first frequency control word to generate a first clock signal; and performing phase selection on the first clock signal based on the carrier clock signal to obtain a second clock signal.

In a possible implementation, the method further includes: performing active load modulation by using the second clock signal.

In a possible implementation, the performing phase selection on the first clock signal based on the carrier clock signal includes: sampling the first clock signal at a first sampling frequency to obtain N sampling clock signals, where the first sampling frequency is N times a frequency of the first clock signal, and N is a positive integer; and obtaining, from the N sampling clock signals based on a first phase sampling signal of a data frame and a phase shift accumulated from a second carrier frequency offset between the carrier clock signal and the first clock signal, a second clock signal having a smallest phase difference from the carrier clock signal.

In a possible implementation, before the generating a first frequency control word based on the first carrier frequency offset, the method further includes: determining that the first carrier frequency offset is greater than a first threshold.

In a possible implementation, before the second clock signal having the smallest phase difference from the carrier clock signal is obtained from the N sampling clock signals, it is determined that a phase shift accumulated from the second carrier frequency offset is greater than a second threshold.

In a possible implementation, before the determining a first carrier frequency offset between a local clock signal and a carrier clock signal that is determined based on a received signal, the method further includes determining to use binary phase shift keying BPSK based on the data frame.

In a possible implementation, when it is determined, based on the data frame, to use non-BPSK, the carrier clock signal is obtained at a first bit in the data frame, and a second frequency control word is generated based on the carrier clock signal; frequency control is performed on the local clock signal based on the second frequency control word to generate a third clock signal; phase selection is performed on the third clock signal based on the carrier clock signal to obtain a fourth clock signal; and active load modulation is performed by using the fourth clock signal to transmit a second bit in the data frame, where the first bit is different from the second bit.

For technical effects brought by any possible implementation of the second aspect or the third aspect, refer to technical effects brought by the foregoing different implementations of the first aspect. Details are not described herein again.

BRIEF DESCRIPTION OF DRAWINGS

FIG. 1 is a schematic structural diagram of an NFC communication system according to an embodiment of this application;

FIG. 2 is a schematic waveform diagram of modulating a subcarrier signal on a carrier of an NFC card reader by an NFC card device according to an embodiment of this application;

FIG. 4 is a schematic waveform diagram of modulating a subcarrier signal on a carrier of an NFC card reader by an NFC card device according to still another embodiment of this application;

FIG. 5 is a schematic waveform diagram of modulating a subcarrier signal on a carrier of an NFC card reader by an NFC card device according to yet another embodiment of this application;

FIG. 6 is a schematic structural diagram of an NFC communication system according to another embodiment of this application;

DESCRIPTION OF EMBODIMENTS

The following describes the technical solutions in embodiments of this application with reference to the accompanying drawings in embodiments of this application. Clearly, the described embodiments are merely some rather than all of embodiments of this application.

The terms "first" and "second" mentioned below are merely intended for a purpose of description, and shall not be understood as an indication or implication of relative importance or implicit indication of the number of indicated technical features. Therefore, a feature limited by "first" or "second" may explicitly or implicitly include one or more of the features. In the descriptions of embodiments of this application, unless otherwise stated, "a plurality of" means two or more than two.

In this application, unless otherwise explicitly specified and limited, the term "connection" should be understood in a broad sense. For example, the "connection" may be a fixed connection, a detachable connection, or an integrated connection; or the "connection" may be a direct connection, an indirect connection through an intermediary.

First, application scenarios of embodiments of this application are described as follows:

Embodiments of this application relate to a load modulation technology in near-field communication (NFC). More specifically, embodiments of this application relate to active load modulation (ALM) in NFC. Embodiments of this application are mainly applied to an NFC communication system that includes an NFC card reader and an NFC card device. Embodiments of this application relate to phase alignment of a transmitted signal of an NFC card device and a carrier of an NFC card reader for ALM transmission. Active load modulation (ALM) is an advanced technology currently used in all mobile NFC solutions in the market. In one embodiment, the ALM is an active transmission of a 13.56 MHz signal modulated according to a Type A/Type B/Type F standard. This can greatly enhance generated signal strength and allow use of smaller antennas by satisfying needed standards of NFC Forum, ISO 14443 (contactless IC card standard (contactless card standards)), EMVCo, and the like regarding load modulation amplitude parameters.

In embodiments of this application, the term "NFC card reader" refers to an NFC-capable device that initiates an NFC connection. The term "NFC card device" refers to a device that supports NFC in response to a request from an NFC card reader. The NFC card reader or the NFC card device is a mobile phone, a tablet computer, a personal computer (PC), a personal digital assistant (PDA), a smart watch, a netbook, a wearable electronic device, an augmented reality (AR) device, a virtual reality (VR) device, an in-vehicle device, a smart car, smart audio, a robot, smart glasses, and the like of different types of electronic devices.

Figure 3:
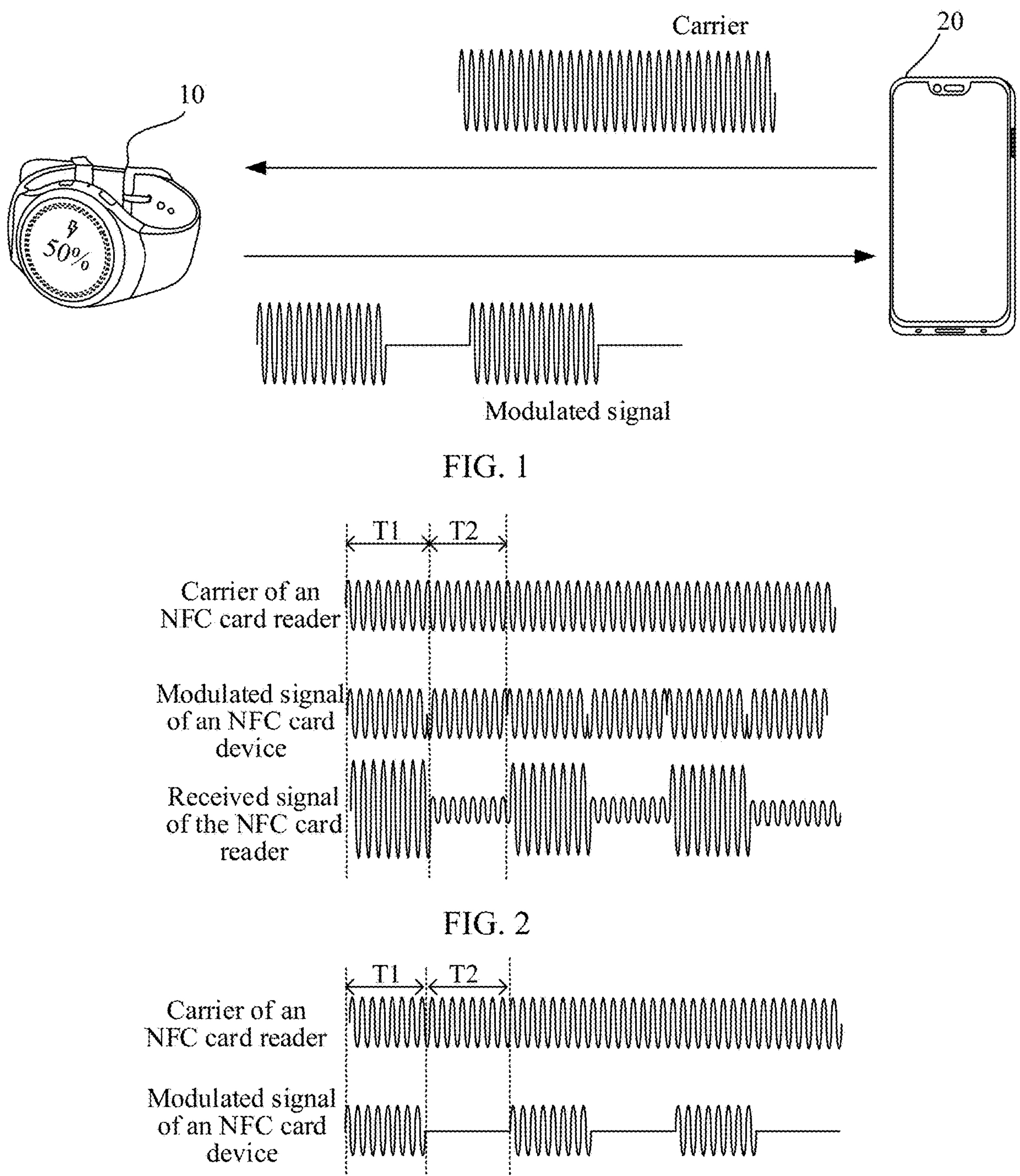
FIG. 3 is a schematic waveform diagram of modulating a subcarrier signal on a carrier of an NFC card reader by an NFC card device according to another embodiment of this application.

Refer to FIG. 1. An embodiment of this application provides an NFC communication system, including an NFC card reader 20 and an NFC card device 10. In an NFC communication scenario, after the NFC card reader 20 starts a field, the NFC card reader 20 sends a carrier. The NFC card device 10 modulates a subcarrier signal (a modulated signal or a transmitted signal) on the carrier through load modulation. Specifically, a BPSK ALM is used as an example. Refer to FIG. 2. After the NFC card device 10 modulates a subcarrier signal on a carrier of the NFC card reader 20, in a time period T1, a modulated signal transmitted by the NFC card device 10 and the carrier of the NFC card reader 20 are fields in a same direction. After the carrier of the NFC card reader 20 is superimposed with the modulated signal, amplitude is enhanced to be used for representing bit 1. In a time period T2, the modulated signal transmitted by the NFC card device 10 and the carrier of the NFC card reader 20 are fields in an opposite direction. After the amplitude of the carrier of the NFC card reader 20 is superimposed with the modulated signal, the amplitude is weakened to be used for representing bit 0. A non-BPSK ALM is used as an example. Refer to FIG. 3. After the NFC card device 10 modulates a subcarrier signal on a carrier of the NFC card reader 20, in a time period T1, a modulated signal transmitted by the NFC card device 10 and the carrier of the NFC card reader 20 are fields in a same direction. After the carrier of the NFC card reader 20 is superimposed with the modulated signal, amplitude is enhanced to be used for representing bit 1. In a time period T2, the NFC card device 10 does not transmit the modulated signal, and the amplitude of the carrier of the NFC card reader 20 remains unchanged, and is used for representing bit 0. Clearly, the BPSK ALM has a larger modulation amplitude than the non-BPSK ALM and is therefore more suitable for smaller antennas or for higher signal strength.

Generally, when the modulated signal of the NFC card device 10 is phase aligned with the carrier of the NFC card reader 20, the NFC card reader 20 can demodulate a correct transmitted signal based on a received signal. However, when the modulated signal of the NFC card device 10 is not phase aligned with the carrier of the NFC card reader 20, as shown in FIG. 4, modulation amplitude generated by the ALM is severely weakened. In addition, as shown in FIG. 5, when a frequency difference exists between the modulated signal transmitted by the NFC card reader 20 and the carrier of the NFC card reader 20, the frequency difference accumulates into a phase error that varies with time, so that modulation amplitude varies with time. As a result, the NFC card reader 20 fails to demodulate the received signal.

Therefore, to resolve the foregoing problem, a fast phase synchronization method of a near-field communication chip needs to be designed. Refer to FIG. 6. An embodiment of this application provides an NFC card device 10, including a near-field communication chip 101, a receiver circuit 102, a transmitter circuit 103, and a first antenna 105. The near-field communication chip 101 is coupled to the receiver circuit 102 and the transmitter circuit 103. The first antenna 105 is coupled to the receiver circuit 102 and the transmitter circuit 103. In a receive mode, the receiver circuit 102 obtains a received radio frequency signal from the first antenna 105, and obtains a received signal from the received radio frequency signal. In a transmit mode, the transmitter circuit 103 is configured to generate a radio frequency transmit signal from a data frame by using a second clock signal sent by active load modulation based on the near-field communication chip 101, and transmit the radio frequency transmit signal through the first antenna 105. For example, the receiver circuit 102 and the transmitter circuit 103 may be connected to the first antenna 105 through a matching network 104. The matching network 104 provides impedance matching between the receiver circuit 102 and the first antenna 105 or between the transmitter circuit 103 and the first antenna 105. The first antenna 105 may be a single induction loop antenna. The matching network 104 may include a capacitor and an inductor, which together with the first antenna 105 form a resonant circuit. Correspondingly, the NFC card reader 20 also includes a second antenna 201. The NFC card reader 20 may form a transmit field through the second antenna 201, and be coupled to the NFC card device 10 through the first antenna 105. The NFC card device 10 may form a transmit field through the first antenna 105, and be coupled to the NFC card reader 20 by using the second antenna 201. Therefore, signal transmission between the NFC card reader 20 and the NFC card device 10 is formed.

FIG. 6 is a schematic diagram of a hardware structure of a near-field communication chip 101. The near-field communication chip 101 specifically includes a processing circuit 1011, a phase-locked loop 1012, and a phase alignment circuit 1013.

The processing circuit 1011 may be a central processing unit (CPU), or may be another general purpose processor, a digital signal processor (DSP), or an application specific integrated circuit (ASIC), a field programmable gate array (FPGA) or another programmable logic device, a discrete gate or a transistor logic device, a discrete hardware component, or the like. The general purpose processor may be a microprocessor, or the processor may be any conventional processor or the like. In an embodiment of this application, the processing circuit 1011 may include a frequency offset estimation module and an accumulator.

For phase-locked loop 1012, a typical phase-locked loop 1012 generally includes a phase detector, a loop filter, a voltage-controlled oscillator, and a frequency divider. When the phase-locked loop works, a local clock signal output by a reference frequency source is used for controlling a frequency and a phase of an oscillatory signal in a loop, to implement automatic tracking for frequency of an output signal to frequency of an input signal. A working principle of the phase-locked loop is that a phase difference between an input local clock signal and an output signal of the voltage-controlled oscillator is detected by the phase detector. The frequency divider is configured to convert the output signal of the voltage-controlled oscillator into a phase signal. A detected phase difference signal is converted into a voltage signal by the phase detector and output. A control voltage of the voltage-controlled oscillator is formed after being filtered by the loop filter. A frequency of the output signal of the voltage-controlled oscillator is controlled. Then the frequency and phase of the output signal of the voltage-controlled oscillator are fed back to the phase detector through a feedback path (which is the frequency divider).

The phase alignment circuit 1013 is configured to adjust a phase of a signal output by the phase-locked loop 1012 as a clock signal of the transmitter circuit 103 of the NFC card device 10. The phase alignment circuit 1013 may include one or more logic devices, discrete gates or transistor logic devices, discrete hardware components, and the like.

The foregoing processing circuit 1011, the phase-locked loop 1012, and the phase alignment circuit 1013 are connected to each other through a communication line, and various frequency or phase information is transmitted between the foregoing components.

In some embodiments, a memory may further be included. The memory may be a volatile memory or a non-volatile memory, or may include both a volatile memory and a non-volatile memory. The nonvolatile memory may be a read-only memory (ROM), a programmable read-only memory (programmable ROM, PROM), an erasable programmable read-only memory (erasable PROM, EPROM), an electrically erasable programmable read-only memory (electrically EPROM, EEPROM), or a flash memory. The volatile memory may be a random access memory (RAM) that is used as an external cache. Through illustrative but not limited description, many forms of RAMs may be used, for example, a static random access memory (static RAM, SRAM), a dynamic RAM (DRAM), a synchronous DRAM (SDRAM), a double data rate SDRAM (DDR SDRAM), an enhanced synchronous dynamic random access memory (enhanced SDRAM, ESDRAM), a synchronous link DRAM (synchlink DRAM, SLDRAM), and a direct rambus RAM (DR RAM), or another magnetic storage device, or any other medium that can be used for carrying or storing desired program code in a form of instructions or a data structure and that can be accessed by a computer, but is not limited thereto. The memory may exist independently, and is connected to the processing circuit 1011 through a communication line. Alternatively, the memory may be integrated with the processing circuit 1011.

The storage circuit 1011 is configured to store computer-executable instructions used for implementing solutions of this application, and the processing circuit 1011 controls execution of the computer-executable instructions. The processing circuit 1011 is configured to execute the computer-executable instructions stored in the memory, to implement the phase synchronization method of a near-field communication chip provided in the following embodiment of this application.

It should be noted that the memory described in this specification includes but is not limited to, these and any other suitable types of memories.

Optionally, the computer-executable instructions in this embodiment of this application may also be referred to as application program code, instructions, a computer program, or another name. This is not specifically limited in this embodiment of this application.

Figure 7:
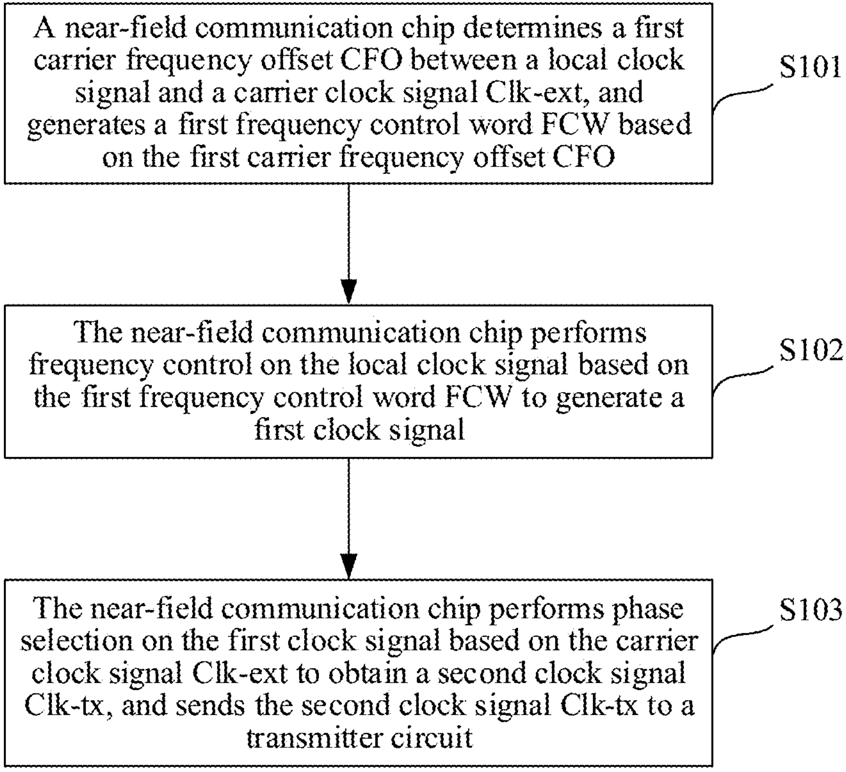
FIG. 7 is a schematic flowchart of a phase synchronization method according to an embodiment of this application.

Based on the foregoing near-field communication chip, an embodiment of this application provides a phase synchronization method of a near-field communication chip. Refer to FIG. 7. The method includes the following steps.

S101. The near-field communication chip determines a first carrier frequency offset CFO between a local clock signal and a carrier clock signal Clk-ext, and generates a first frequency control word FCW based on the first carrier frequency offset CFO.

In a receive mode, the near-field communication chip obtains a received signal through a receiver circuit, and determines the carrier clock signal Clk-ext based on the received signal. Step S101 is mainly implemented by the processing circuit 1011 in the receive mode. Specifically, after the receiver circuit locks automatic generation control (AGC), the processing circuit 1011 recovers a carrier clock signal Clk-ext (which is also referred to as a field recovery clock signal) from the received signal. The local clock signal may be a clock signal provided by a clock source (e.g., a crystal oscillator) of a locked NFC card device 10 in the phase-locked loop 1012.

S102. The near-field communication chip performs frequency control on the local clock signal based on the first frequency control word FCW to generate a first clock signal.

Specifically, in step S102, the phase-locked loop 1012 generates the first clock signal based on the local clock signal and the first frequency control word.

S103. The near-field communication chip performs phase selection on the first clock signal based on the carrier clock signal Clk-ext to obtain a second clock signal Clk-tx, and sends the second clock signal Clk-tx to a transmitter circuit.

The second clock signal Clk-tx is used by the transmitter circuit to transmit a data frame Tx-data by using active load modulation in a transmit mode.

In this way, the chip provided in embodiments of this application can first recover, in the receive mode, the carrier clock signal Clk-ext from the received signal received by the receiver circuit, and determine the first carrier frequency offset CFO between the local clock signal and the carrier clock signal Clk-ext. Then, the first frequency control word FCW generated by the first carrier frequency offset CFO controls the phase-locked loop to generate the first clock signal based on the local clock signal. Finally, the phase alignment circuit performs phase selection on the first clock signal based on the carrier clock signal Clk-ext to obtain the second clock signal. In other words, the second clock signal and the carrier clock signal are phase aligned. Therefore, in a transmit mode, when the transmitter circuit transmits the data frame by using the second clock signal through active load modulation, it can be ensured that a formed transmitted signal is phase aligned with the carrier clock signal, so that fast synchronization between a transmitted signal of an NFC card device and a carrier of an NFC card reader can be implemented.

Figure 8:
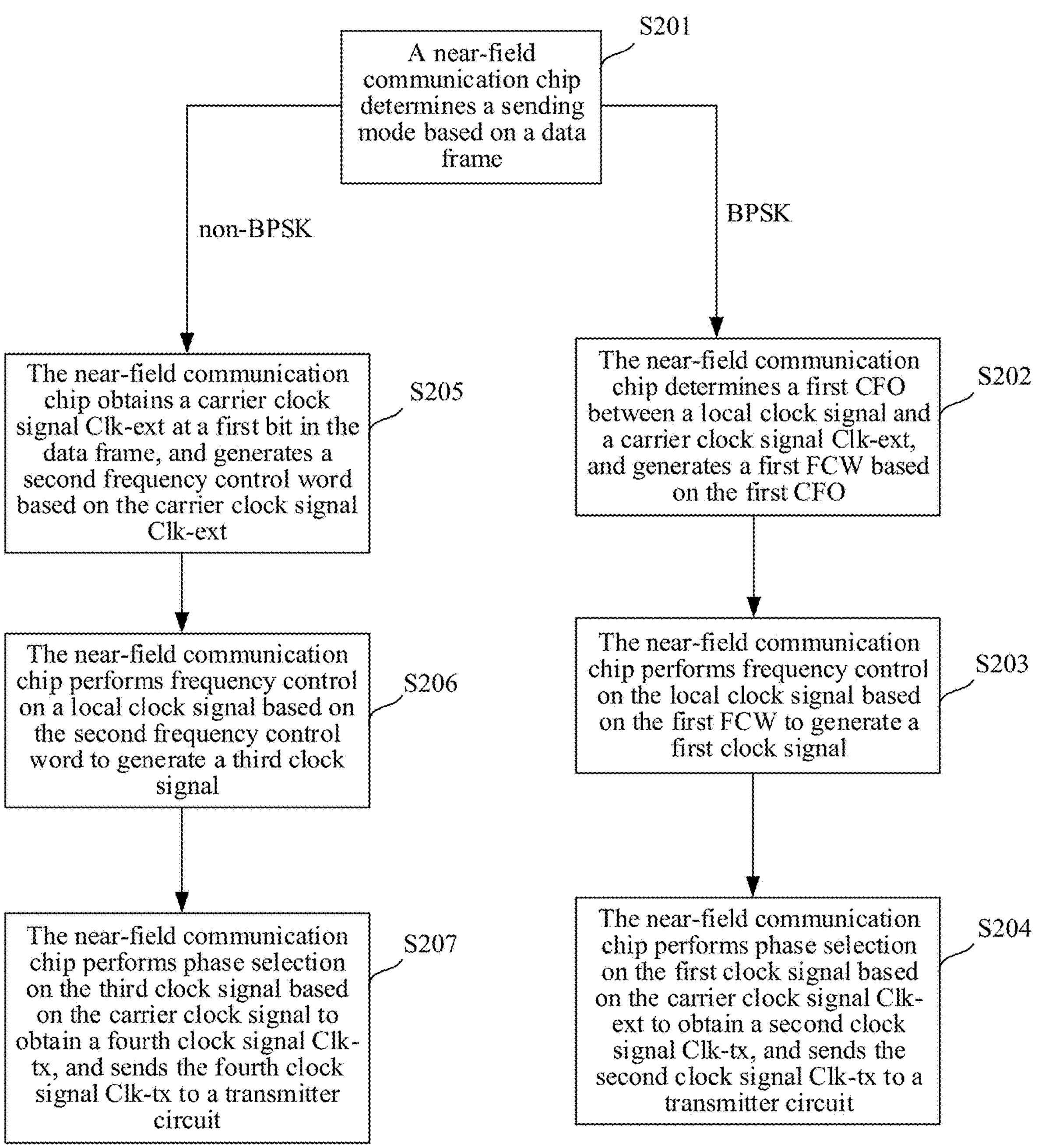
FIG. 8 is a schematic flowchart of a phase synchronization method according to another embodiment of this application.

In an embodiment, the near-field communication chip provided in this embodiment of this application may be compatible with BPSK and non-BPSK modes. Refer to FIG. 8. Another phase synchronization method of a near-field communication chip provided in an embodiment of this application includes the following steps.

S201. The near-field communication chip determines a sending mode based on a data frame.

When it is determined, based on the data frame, to use binary phase shift keying BPSK, step S202 to step S204 are performed. When it is determined, based on the data frame, to use non-binary phase shift keying non-BPSK, step S205 to step S207 are performed.

S202. The near-field communication chip determines a first CFO between a local clock signal and a carrier clock signal Clk-ext, and generates a first FCW based on the first CFO.

Figure 10:
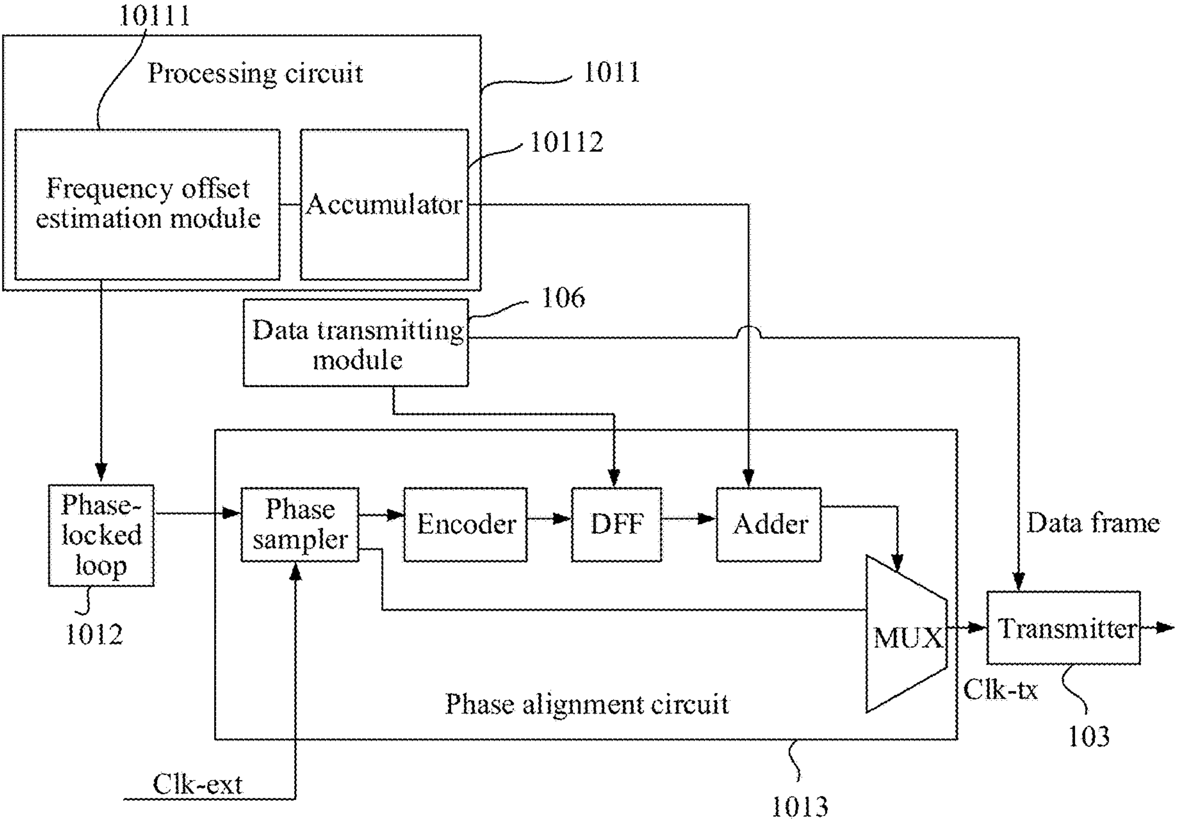
FIG. 10 is a schematic structural diagram of a near-field communication chip according to an embodiment of this application.

The carrier clock signal Clk-ext is determined based on a received signal received by the near-field communication chip. Refer to FIG. 10. The processing circuit 1011 may include a frequency offset estimation module 10111, and step S202 may be specifically performed by the frequency offset estimation module 10111. Specifically, after a receiver circuit locks AGC, the processing circuit 1011 recovers Clk-ext from the received signal. The frequency offset estimation module 10111 may estimate the first CFO between the local clock signal and the carrier clock signal Clk-ext through a ferror function. In addition, the NFC card device 10 may further include a data transmitting module 106. The data transmitting module 106 may be specifically a baseband processing circuit, and is configured to generate the foregoing data frame.

S203. The near-field communication chip performs frequency control on the local clock signal based on the first FCW to generate a first clock signal.

Figure 9:
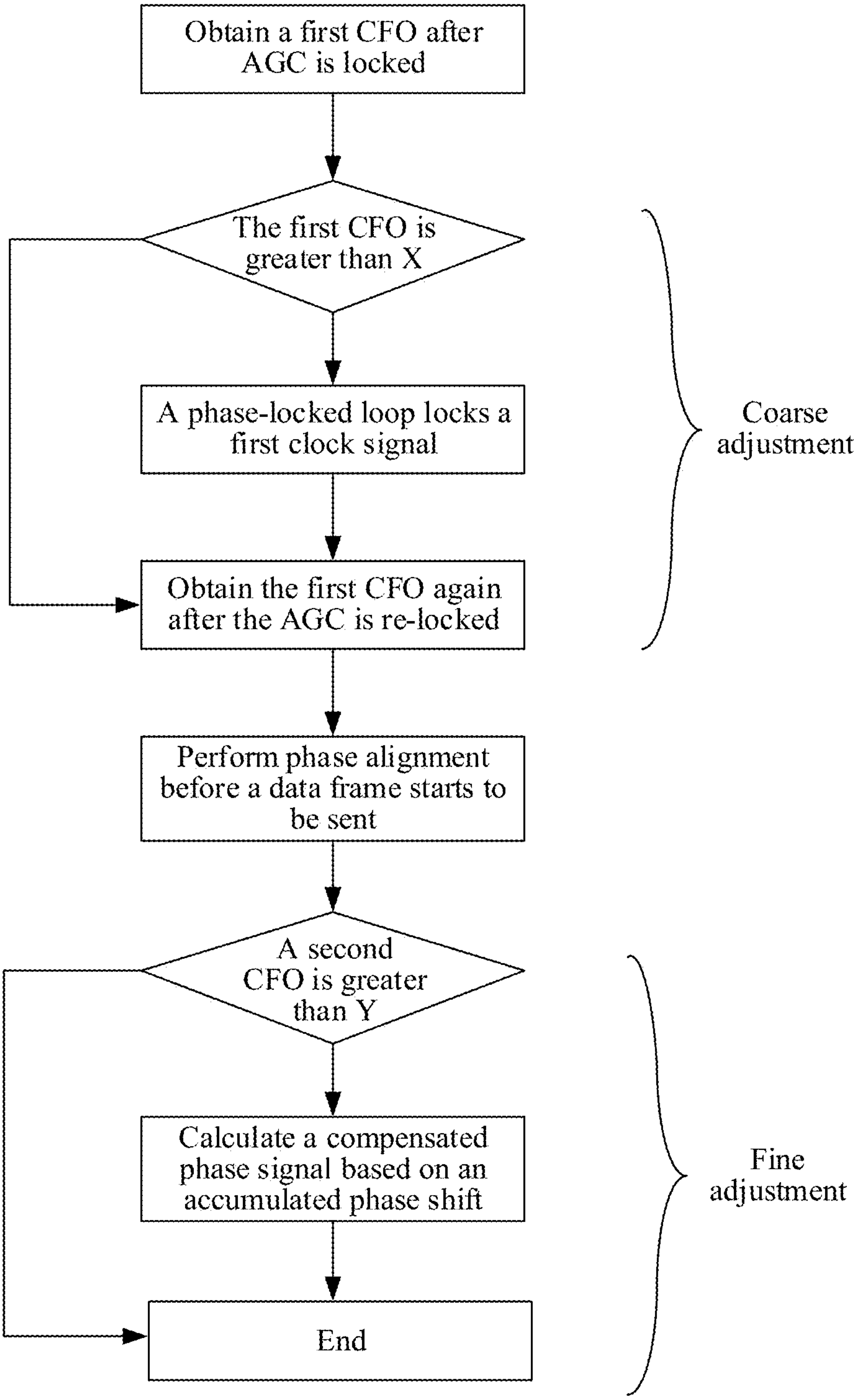
FIG. 9 is a schematic flowchart of a phase synchronization method according to still another embodiment of this application.

In the process S203, the phase-locked loop adjusts the local clock signal based on the first FCW to lock the first clock signal. To avoid excessively frequent adjustment of an output of the phase-locked loop, a first threshold X may be set for the first CFO. The processing circuit generates the first FCW only when determining that the first CFO is greater than the first threshold X. The first CFO implements coarse adjustment on the local clock signal locked by the phase-locked loop to generate the first clock signal. After the first clock signal is generated, the receiver circuit re-locks the AGC, and the first CFO is estimated, as shown in FIG. 9.

S204. The near-field communication chip performs phase selection on the first clock signal based on the carrier clock signal Clk-ext to obtain a second clock signal Clk-tx, and sends the second clock signal Clk-tx to a transmitter circuit.

The second clock signal Clk-tx is used by the transmitter circuit to transmit a data frame by using active load modulation in a transmit mode.

Specifically, S204 includes: The near-field communication chip samples the first clock signal at a first sampling frequency to obtain N sampling clock signals, where the first sampling frequency is N times a frequency of the first clock signal; obtains, from the N sampling clock signals based on a first phase sampling signal phase-sample of the data frame and a phase shift phase-shift-dbb accumulated from a second CFO between Clk-ext and the first clock signal, a second clock signal Clk-tx having a smallest phase difference from Clk-ext; and sends Clk-tx to the transmitter circuit. Specifically, refer to FIG. 10. After the phase-locked loop generates the first clock signal in S206, the frequency offset estimation module 10111 of the processing circuit 1011 estimates the second CFO between the first clock signal and the carrier clock signal Clk-ext through the ferror function. A phase shift caused by the second CFO in a data frame transmission process is accumulated through an accumulator 10112. It may be understood that, when the second CFO exists between the first clock signal and the carrier clock signal Clk-ext, the phase shift is accumulated once every clock cycle to form a larger phase shift. Phase alignment is performed before the data frame starts to be sent. Certainly, if a phase shift caused by the second CFO in a process of sending a frame of data does not affect normal demodulation of a signal by the NFC card reader 20, phase alignment may be performed. The phase alignment may be performed only when the phase shift caused by the second CFO affects normal demodulation of a signal by the NFC card reader 20. Therefore, a second threshold Y may be set for the second CFO. When determining that the second CFO is greater than the second threshold, the processing circuit 1011 of the near-field communication chip calculates a compensated phase signal obtained after phase compensation based on the phase shift phase-shift-dbb, and updates the second clock signal, thereby implementing fine adjustment to a phase, as shown in FIG. 9.

Figures 11, 12:
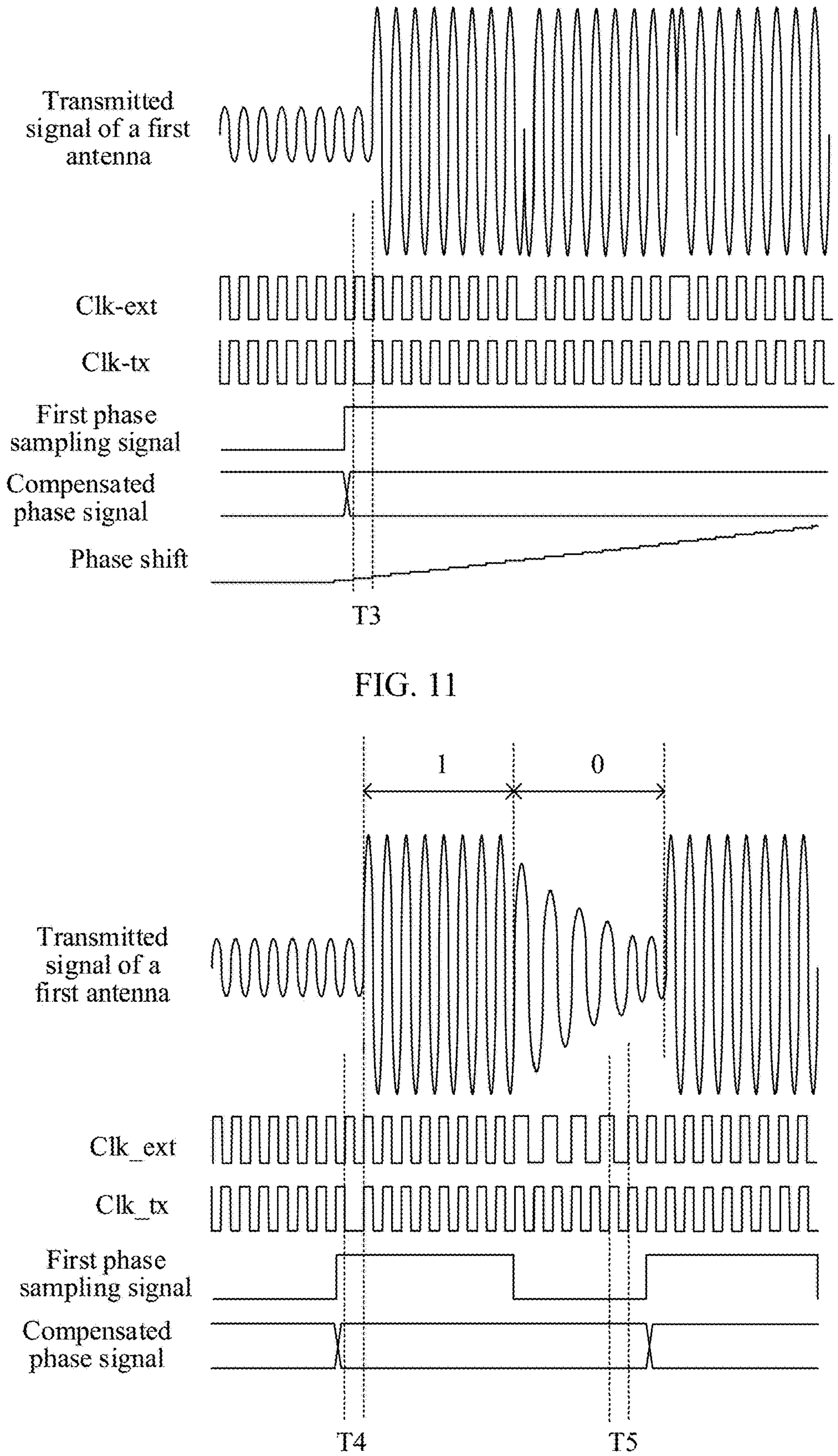
FIG. 11 is a signal time sequence diagram in a BPSK mode according to an embodiment of this application.
FIG. 12 is a signal time sequence diagram in a non-BPSK mode according to an embodiment of this application.

With reference to FIG. 10, when the phase alignment circuit of the near-field communication chip is implemented through one or more logic circuits, the phase alignment circuit may specifically include: a phase sampler, an encoder (decoder), a D-type flip flop (DFF), an adder, and a MUX (multiplexer, data selector). With reference to a time sequence diagram of a transmitted signal of a first antenna, Clk-ext, Clk-tx, a first phase sampling signal phase-sample, a compensated phase signal phase-sel<5:0>, and a phase shift that are shown in FIG. 11, step S204 is described as follows: The phase sampler may sample a first clock signal (e.g., 13.56 MHz) at a first sampling frequency (e.g., 867.84 MHz), to generate 64 sampling clock signals having different phases. One channel of 64 sampling clock signals p<1:64> is directly sent to the MUX. For another channel of 64 sampling clock signals O<1:64>, it is determined that a sampling clock signal having a smallest phase difference from the carrier clock signal Clk-ext is phase encoded through an encoder, and phase alignment is performed with the first phase sampling signal phase-sample of a data frame through a DFF. Then, the phase shift phase-shift-dbb caused by a second CFO is compensated through an adder. Finally, the adder outputs the compensated phase signal phase-sel<5:0> after phase compensation, and then the MUX selects a second clock signal from one channel of 64 sampling clock signals p<1:64> based on the compensated phase signal phase-sel<5:0>. Because oversampling is performed on the first clock signal at the first sampling frequency, phase alignment may be implemented in one clock cycle (T3 between dotted lines shown in FIG. 11). When the phase sampler uses 64 times oversampling, the phase error can be ensured to be less than) 6° (360°/64≈6°. In addition, the first CFO is obtained by estimating a frequency offset between the local clock signal and Clk-ext in a receive mode. Therefore, in a BPSK mode, especially in a single-antenna scenario, after the data frame starts to be sent, because a transmitter circuit keeps transmitting (as shown in FIG. 2, a receiver circuit is in a saturated state), Clk-ext cannot be recovered. However, the phase alignment can still be performed on the transmitted signal of the NFC card device and a carrier of the NFC card reader to implement fast synchronization.

S205. The near-field communication chip obtains a carrier clock signal Clk-ext at a first bit in the data frame, and generates a second frequency control word based on the carrier clock signal Clk-ext.

Specifically, refer to FIG. 3 and FIG. 12. The first bit may be 0, and the NFC card device 10 does not transmit a modulated signal at bit 0. In this case, the processing circuit 1011 recovers the carrier clock signal Clk-ext from a received signal (which is a carrier sent by the NFC card reader 20). Then, the processing circuit 1011 performs step S205.

S206. The near-field communication chip performs frequency control on a local clock signal based on the second frequency control word to generate a third clock signal.

In step S206, the phase-locked loop of the near-field communication chip generates the third clock signal based on the local clock signal and the second frequency control word. For the process, refer to a process in which the phase-locked loop generates the first clock signal based on the local clock signal and the first FCW in step S203. Details are not described herein again.

S207. The near-field communication chip performs phase selection on the third clock signal based on the carrier clock signal to obtain a fourth clock signal Clk-tx, and sends the fourth clock signal Clk-tx to a transmitter circuit.

The fourth clock signal is used by the transmitter circuit to transmit a second bit in the data frame by using active load modulation in the transmit mode. The first bit is different from the second bit. For example, when the first bit is 0, the second bit is 1. For a process of performing phase selection on the third clock signal based on the carrier clock signal in step S207, refer to a process of performing phase selection on the first clock signal based on the carrier clock signal in step S204. FIG. 12 is a time sequence diagram of a transmitted signal of a first antenna, Clk-ext, Clk-tx, a first phase sampling signal phase-sample, and a compensated phase signal phase-sel<5:0>. Details are not described herein again. A difference is that, as shown in FIG. 11, in the BPSK mode, Clk-ext cannot be restored, because the transmitter circuit keeps transmitting (as shown in FIG. 2, the receiver circuit is in a saturated state) after the data frame starts to be sent. As shown in FIG. 12, in a non-BPSK mode, after the data frame starts to be sent, because the transmitter circuit does not transmit at bit 0 but transmits at bit 1 after the data frame starts to be sent, steps S205 and S206 may be performed at bit 0. For example, phase alignment is performed on T4 (one clock cycle) before bit 1 or T5 (one clock cycle) before bit 1 in FIG. 12, and then bit 1 in the data frame is sent through a fourth clock signal obtained after phase alignment.

An embodiment of this application further provides a computer-readable storage medium. The computer-readable storage medium stores instructions. The instructions, when run on a computer, enable the computer to perform the phase synchronization method corresponding to the foregoing method embodiment.

An embodiment of this application further provides a computer program product including instructions. The instructions, when run on a computer, enable the computer to perform the phase synchronization method corresponding to the foregoing method embodiment.

For technical effects of the electronic device, the computer-readable storage medium, and the computer program product in embodiments of this application, refer to the foregoing technical effects of the phase synchronization method. Details are not repeated herein again.

It should be understood that sequence numbers of the foregoing processes do not mean execution sequences in various embodiments of this application. The execution sequences of the processes should be determined based on functions and internal logic of the processes, and should not be construed as any limitation on the implementation processes of embodiments of this application.

A person of ordinary skill in the art may be aware that, in combination with the examples described in embodiments disclosed in this specification, units and algorithm steps can be implemented by electronic hardware or a combination of computer software and electronic hardware. Whether the functions are performed by hardware or software depends on particular applications and design constraints of the technical solutions. A person skilled in the art may use different methods to implement the described functions of each particular application, but it should not be considered that the implementation goes beyond the scope of this application.

It may be clearly understood by a person skilled in the art that, for convenient and brief description, for a detailed working process of the foregoing system, apparatus, and units, refer to a corresponding process in the foregoing method embodiments. Details are not described herein again.

In the several embodiments provided in this application, it should be understood that the disclosed system, device, and method may be implemented in other manners. For example, the described device embodiments are merely examples. For example, the unit division is merely logical function division and can be other division in actual implementation. For example, multiple units or components can be combined or integrated into another system, or some features can be ignored or not performed. In addition, the displayed or discussed mutual couplings or direct couplings or communication connections are implemented through some interfaces. The indirect couplings or communication connections between the devices or units may be implemented in electronic, mechanical, or other forms.

The units described as separate parts may or may not be physically separate, and parts displayed as units may or may not be physical units, and may be located at one location, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit.

All or a part of the foregoing embodiments may be implemented by software, hardware, firmware, or any combination thereof. When a software program is used to implement embodiments, all or a part of embodiments may be implemented in a form of a computer program product. The computer program product includes one or more computer instructions. When the computer program instructions are loaded and executed on a computer, the procedures or functions according to embodiments of this application are all or partially generated. The computer may be a general-purpose computer, a dedicated computer, a computer network, or any other programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (e.g., a coaxial cable, an optical fiber, or a digital subscriber line (DSL)) or wireless (e.g., infrared, radio, or microwave) manner. The computer-readable storage medium may be any usable medium accessible by a computer, or a data storage device, such as a server or a data center, integrating one or more usable media. The usable medium may be a magnetic medium (e.g., a floppy disk, a hard disk, or a magnetic tape), an optical medium (e.g., a DVD), a semiconductor medium (e.g., a solid-state disk (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A near-field communication chip, comprising:

a processing circuit, configured to determine a first carrier frequency offset between a local clock signal and a carrier clock signal, and generate a first frequency control word based on the first carrier frequency offset, wherein the carrier clock signal is determined based on a received signal received by the near-field communication chip;

a phase-locked loop, configured to generate a first clock signal based on the local clock signal and the first frequency control word; and a phase alignment circuit, configured to perform phase selection on the first clock signal based on the carrier clock signal to obtain a second clock signal, and send the second clock signal to a transmitter circuit, wherein the processing circuit is configured to generate the first frequency control word in accordance with determining that the first carrier frequency offset is greater than a first threshold.

2. The near-field communication chip according to claim 1, wherein the phase alignment circuit is further configured to:

sample the first clock signal at a first sampling frequency to obtain N sampling clock signals, wherein the first sampling frequency is N times a frequency of the first clock signal, and N is a positive integer;

obtain, from the N sampling clock signals based on a first phase sampling signal of a data frame and a phase shift accumulated from a second carrier frequency offset that is between the carrier clock signal and the first clock signal and that is generated by the processing circuit, a second clock signal having a smallest phase difference from the carrier clock signal; and send the second clock signal to the transmitter circuit.

3. The near-field communication chip according to claim 2, wherein the phase alignment circuit is configured to: in accordance with a determination made by the processing circuit that the second carrier frequency offset is greater than a second threshold, obtain the second clock signal having the smallest phase difference from the carrier clock signal.

4. The near-field communication chip according to claim 1, wherein the processing circuit is further configured to obtain the carrier clock signal of the received signal in accordance with a determination of using binary phase shift keying (BPSK) based on a data frame.

5. The near-field communication chip according to claim 1, wherein the processing circuit is further configured to: in accordance with a determination of using non-binary phase shift keying non-binary phase shift keying (non-BPSK) based on the data frame, obtain the carrier clock signal at a first bit in a data frame, and generate a second frequency control word based on the carrier clock signal;

the phase-locked loop is configured to generate a third clock signal based on the local clock signal and the second frequency control word; and the phase alignment circuit is configured to perform phase selection on the third clock signal based on the carrier clock signal to obtain a fourth clock signal, and send the fourth clock signal to the transmitter circuit, wherein the fourth clock signal is used by the transmitter circuit to transmit a second bit in the data frame, and the first bit is different from the second bit.

6. An electronic device, comprising a near-field communication chip, a receiver circuit, and a transmitter circuit, wherein the near-field communication chip is separately coupled to the receiver circuit and the transmitter circuit, wherein the near-field communication chip is configured to perform the operations of:

obtaining a received signal through the receiver circuit;

determining a carrier clock signal based on the received signal;

determining a first carrier frequency offset between a local clock signal of the near-field communication chip and the carrier clock signal;

generating a first frequency control word based on the first carrier frequency offset;

performing frequency control on the local clock signal based on the first frequency control word to generate a first clock signal;

performing phase selection on the first clock signal based on the carrier clock signal to obtain a second clock signal; and sending the second clock signal to the transmitter circuit; and wherein the transmitter circuit is configured to perform active load modulation by using the second clock signal, wherein the near-field communication chip is configured to perform the generating the first frequency control word in accordance with determining that the first carrier frequency offset is greater than a first threshold.

7. The electronic device according to claim 6, wherein the near-field communication chip is further configured to sample the first clock signal at a first sampling frequency to obtain N sampling clock signals, wherein the first sampling frequency is N times a frequency of the first clock signal, and N is a positive integer; and obtain, from the N sampling clock signals based on a first phase sampling signal of a data frame and a phase shift accumulated from a second carrier frequency offset between the carrier clock signal and the first clock signal, a second clock signal having a smallest phase difference from the carrier clock signal.

8. The electronic device according to claim 7, wherein the near-field communication chip is further configured to: before obtaining, from the N sampling clock signals, the second clock signal having the smallest phase difference from the carrier clock signal, determine that a phase shift accumulated from the second carrier frequency offset is greater than a second threshold.

9. The electronic device according to claim 6, wherein before determining the first carrier frequency offset between the local clock signal and the carrier clock signal, the near-field communication chip is further configured to determine to use binary phase shift keying (BPSK) based on a data frame.

10. The electronic device according to claim 6, wherein the near-field communication chip is further configured to: in accordance with a determination of using non-binary phase shift keying (non-BPSK) based on the data frame, obtain the carrier clock signal at a first bit in a data frame, and generate a second frequency control word based on the carrier clock signal; perform frequency control on the local clock signal based on the second frequency control word to generate a third clock signal; and perform phase selection on the third clock signal based on the carrier clock signal to obtain a fourth clock signal; and the transmitter circuit is further configured to perform active load modulation by using the fourth clock signal to transmit a second bit in the data frame, wherein the first bit is different from the second bit.

11. A phase synchronization method applied to a near-field communication chip, the method comprising:

determining a first carrier frequency offset between a local clock signal and a carrier clock signal that is determined based on a received signal, and generating a first frequency control word based on the first carrier frequency offset;

performing frequency control on the local clock signal based on the first frequency control word to generate a first clock signal; and performing phase selection on the first clock signal based on the carrier clock signal to obtain a second clock signal, wherein the generating the first frequency control word is performed in accordance with determining that the first carrier frequency offset is greater than a first threshold.

12. The phase synchronization method according to claim 11, further comprising:

performing active load modulation by using the second clock signal.

13. The phase synchronization method according to claim 11, wherein the performing the phase selection on the first clock signal based on the carrier clock signal comprises:

sampling the first clock signal at a first sampling frequency to obtain N sampling clock signals, wherein the first sampling frequency is N times a frequency of the first clock signal, and N is a positive integer; and obtaining, from the N sampling clock signals based on a first phase sampling signal of a data frame and a phase shift accumulated from a second carrier frequency offset between the carrier clock signal and the first clock signal, a second clock signal having a smallest phase difference from the carrier clock signal.

14. The phase synchronization method according to claim 13, wherein before obtaining, from the N sampling clock signals, the second clock signal having the smallest phase difference from the carrier clock signal, the method further comprises determining that a phase shift accumulated from the second carrier frequency offset is greater than a second threshold.

15. The phase synchronization method according to claim 11, wherein before determining the first carrier frequency offset between the local clock signal and the carrier clock signal that is determined based on a received signal, the method further comprises determining to use binary phase shift keying (BPSK) based on a data frame.

16. The phase synchronization method according to claim 11, comprising:

in accordance with a determination of using a non-binary phase shift keying (non-BPSK) based on the data frame, obtaining the carrier clock signal at a first bit in a data frame, and generating a second frequency control word based on the carrier clock signal;

performing frequency control on the local clock signal based on the second frequency control word to generate a third clock signal; and performing phase selection on the third clock signal based on the carrier clock signal to obtain a fourth clock signal; and performing active load modulation by using the fourth clock signal to transmit a second bit in the data frame, wherein the first bit is different from the second bit.

* * * * *